United States Patent
Imai et al.

(10) Patent No.: US 9,960,316 B2
(45) Date of Patent: May 1, 2018

(54) METHOD FOR SEPARATING GROUP 13 ELEMENT NITRIDE LAYER, AND COMPOSITE SUBSTRATE

(71) Applicant: NGK INSULATORS, LTD., Nagoya, Aichi-prefecture (JP)

(72) Inventors: Katsuhiro Imai, Nagoya (JP); Makoto Iwai, Kasugai (JP); Takanao Shimodaira, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days. days.

(21) Appl. No.: 15/609,704

(22) Filed: May 31, 2017

(65) Prior Publication Data

US 2017/0263810 A1 Sep. 14, 2017

Related U.S. Application Data

(63) Continuation of application No. PCT/JP2015/083089, filed on Nov. 25, 2015.

(30) Foreign Application Priority Data

Dec. 3, 2014 (JP) ................................. 2014-244648

(51) Int. Cl.
*H01L 33/00* (2010.01)
*C30B 9/00* (2006.01)
(Continued)

(52) U.S. Cl.
CPC ............ *H01L 33/0079* (2013.01); *C30B 9/00* (2013.01); *C30B 19/02* (2013.01); *C30B 25/18* (2013.01);
(Continued)

(58) Field of Classification Search
CPC .......... H01L 21/0254; H01L 21/02639; H01L 33/007; H01L 33/0079; C30B 25/18; C30B 33/02; C30B 9/00
See application file for complete search history.

(56) References Cited

U.S. PATENT DOCUMENTS

2006/0148186 A1 7/2006 Lee et al.
2014/0147953 A1 5/2014 Iwai et al.

FOREIGN PATENT DOCUMENTS

JP  2006-188409 A  7/2006
JP  2009-111423 A  5/2009
(Continued)

OTHER PUBLICATIONS

International Search Report and Written Opinion for PCT Patent App. No. PCT/JP2015/083089 (dated Feb. 9, 2016) with English translation of the ISR.
(Continued)

*Primary Examiner* — Seahvosh Nikmanesh
(74) *Attorney, Agent, or Firm* — Cermak Nakajima & McGowan LLP; Tomoko Nakajima

(57) ABSTRACT

A composite substrate includes a sapphire substrate and a layer of a nitride of a group 13 element provided on the sapphire substrate. The layer of the nitride of the group 13 element is composed of gallium nitride, aluminum nitride or gallium aluminum nitride. The composite substrate satisfies the following formulas (1), (2) and (3). A laser light is irradiated to the composite substrate from the side of the sapphire substrate to decompose crystal lattice structure at an interface between the sapphire substrate and the layer of the nitride of the group 13 element. 5.0≤(an average thickness (μm) of the layer of the nitride of the group 13 element/a diameter (mm) of the sapphire substrate)≤10.0 . . . (1); 0.1≤ a warpage (mm) of said composite substrate×(50/a diameter (mm) of said composite
(Continued)

substrate)$^2 \leq 0.6$ ... (2); $1.10 \leq$ a maximum value (μm) of a thickness of said layer of said nitride of said group 13 element/a minimum value (μm) of said thickness of said layer of said nitride of said group 13 element ... (3)

9 Claims, 3 Drawing Sheets

(51) Int. Cl.
*C30B 19/02* (2006.01)
*C30B 29/40* (2006.01)
*C30B 33/02* (2006.01)
*H01L 21/02* (2006.01)
*C30B 25/18* (2006.01)

(52) U.S. Cl.
CPC ............ *C30B 29/403* (2013.01); *C30B 33/02* (2013.01); *H01L 21/0254* (2013.01); *H01L 21/02639* (2013.01); *H01L 33/007* (2013.01)

(56) References Cited

FOREIGN PATENT DOCUMENTS

| | | |
|---|---|---|
| JP | 2009-167075 A | 7/2009 |
| JP | 2014-162713 A | 9/2014 |
| WO | WO2013/021804 A1 | 2/2013 |

OTHER PUBLICATIONS

International Preliminary Report on Patentability for PCT Patent App. No. PCT/JP2015/083089 (dated Jun. 15, 2017).

METHOD FOR SEPARATING GROUP 13 ELEMENT NITRIDE LAYER, AND COMPOSITE SUBSTRATE

TECHNICAL FIELD

The present invention relates to a method of separating a layer of a nitride of a group 13 element from a sapphire substrate and a composite substrate.

BACKGROUND ARTS

It is known a method of obtaining a self-supporting GaN crystal as follows. That is, a GaN crystal is grown on a sapphire substrate or a GaN template to obtain a composite substrate, and the GaN crystal is separated from the sapphire substrate by, for example, laser lift-off method to obtain the self-supporting GaN crystal.

According to this method, the composite substrate may be warped due to a difference of thermal expansion between the sapphire substrate and gallium nitride film, resulting in warpage or cracks during the separation of the gallium nitride film by the laser lift-off method.

According to patent document 1, a nitride single crystal is formed on a sapphire substrate by vapor phase process (HVPE, MOCVD, MBE) in a chamber, and the lasser lift-off process is then performed continuously on the site in the same chamber at the same temperature, for eliminating the influences of the warpage of the composite substrate and preventing the generation of the cracks.

Further, the applicant tried to provide a gallium nitride layer on a sapphire substrate while a layer containing inclusions, is provided in an initial stage of the formation of the gallium nitride layer, so that the cracks could be successfully prevented during the laser lift-off process (Patent document 2).

RELATED DOCUMENTS

Patent document 1: Japanese patent publication No. 2006-188409A
Patent document 2: WO 2013/021804 A2
Patent document 3: Japanese patent publication No. 2009-111423A

SUMMARY OF THE INVENTION

However, according to the method of patent document 1, laser light is penetrated through a window of transmitting infrared ray in the chamber to perform the laser lift-off process. A dedicated facility is thereby needed, the efficiency of utilization of the irradiated light during the laser lift-off is low and the adjustment of positions and focusing for the irradiation are difficult. The productivity is thus low. Further, in the case of liquid phase process such as flux method, a high pressure is required so that such chamber equipped with the window for transmitting infrared ray cannot be used. The applicability of the process is thereby limited.

The process of patent document 2 is applicable only to the composite substrate having the specific microstructure, so that its applicable range is also limited.

An object of the present invention is, in separating a specific layer of a nitride of a group 13 element by irradiating laser light to a sapphire substrate, to reduce cracks in the layer of the nitride of the group 13 element.

The present invention provides a method of separating a layer of a nitride of a group 13 element: the method comprising the steps of;

preparing a composite substrate comprising a sapphire substrate and a layer of a nitride of a group 13 element provided on the sapphire substrate, the layer of the nitride of the group 13 element comprising gallium nitride, aluminum nitride or gallium aluminum nitride, and the composite substrate satisfying the following formulas (1), (2) and (3); and irradiating a laser light to the composite substrate from the side of the sapphire substrate to decompose crystal lattice structure at an interface between the sapphire substrate and the layer of the nitride of the group 13 element.

$$5.0 \leq \text{(an average thickness (μm) of the layer of the nitride of the group 13 element/a diameter (mm) of the sapphire substrate)} \leq 10.0 \quad (1)$$

$$0.1 \leq \text{a warpage (mm) of said composite substrate} \times (50/\text{a diameter (mm) of said composite substrate})^2 \leq 0.6 \quad (2)$$

$$1.10 \leq \text{a maximum value (μm) of a thickness of said layer of said nitride of said group 13 element/a minimum value (μm) of said thickness of said layer of said nitride of said group 13 element} \quad (3)$$

The present invention further provides a composite substrate comprising a sapphire substrate and a layer of a nitride of a group 13 element provided on the sapphire substrate:

wherein the layer of the nitride of the group 13 element comprises gallium nitride, aluminum nitride or gallium aluminum nitride; and wherein the above formulas (1), (2) and (3) are satisfied.

The inventors studied, in detail, the cause of the crack generation in a layer of a nitride of a group 13 element in separating the layer of the nitride of the group 13 element by irradiating laser light to a composite substrate from the side of the sapphire substrate. The following findings were thus given.

That is, in the case that the layer of the nitride of the group 13 element is formed on the sapphire substrate, it is usually required a high temperature of 800° C. or higher. The thus obtained composite substrate is then cooled and the laser light is irradiated onto it. During the cooling, the difference of thermal expansion of the sapphire substrate and composite substrate results in the warpage of and considerable residual stress left in the composite substrate.

The crystal lattices of the sapphire substrate and the nitride of the group 13 element form crystal lattice bonds, along an interface between the sapphire substrate and the layer of the nitride of the group 13 element. By irradiating the laser light from the side of the sapphire substrate, the nitride of the group 13 element is decomposed to a metal of the group 13 element and nitrogen so that the crystal lattice bonds are decomposed.

When the laser light is irradiated to decompose the crystal lattice bonds along the interface between the layer of the nitride of the group 13 element and the sapphire substrate, it seems that the nitride of the group 13 element is spatially peeled off from the sapphire substrate in a microscopic view and momentarily bent in the opposite direction due to Twyman effect. It was proved that such momentary bending may cause the cracks.

Then, according to the present invention, the ratio of the average thickness of the layer of the nitride of the group 13 element with respect to the diameter of the sapphire substrate is made in a specific range and the ratio of the warpage of the composite substrate with respect to the diameter of the composite substrate is also made in a specific range, as a supposition. Furthermore, according to the present invention, it was thought that the thickness of the layer of the nitride of the group 13 element is not made constant to provide deviation in the film thickness. It is thus provided that, when the layer of the nitride of the group 13 element is minutely deformed, the internal stress in the layer can be easily dispersed to prevent the cracks in the layer of the nitride of the group 13 element. The present invention is made based on the discovery.

EMBODIMENTS OF THE INVENTION (Construction of Composite Substrate)

According to the present invention, it is used a composite substrate including a sapphire substrate and a layer of a nitride of a group 13 element provided on the sapphire substrate. The composite substrate has a warpage.

Figure 1:
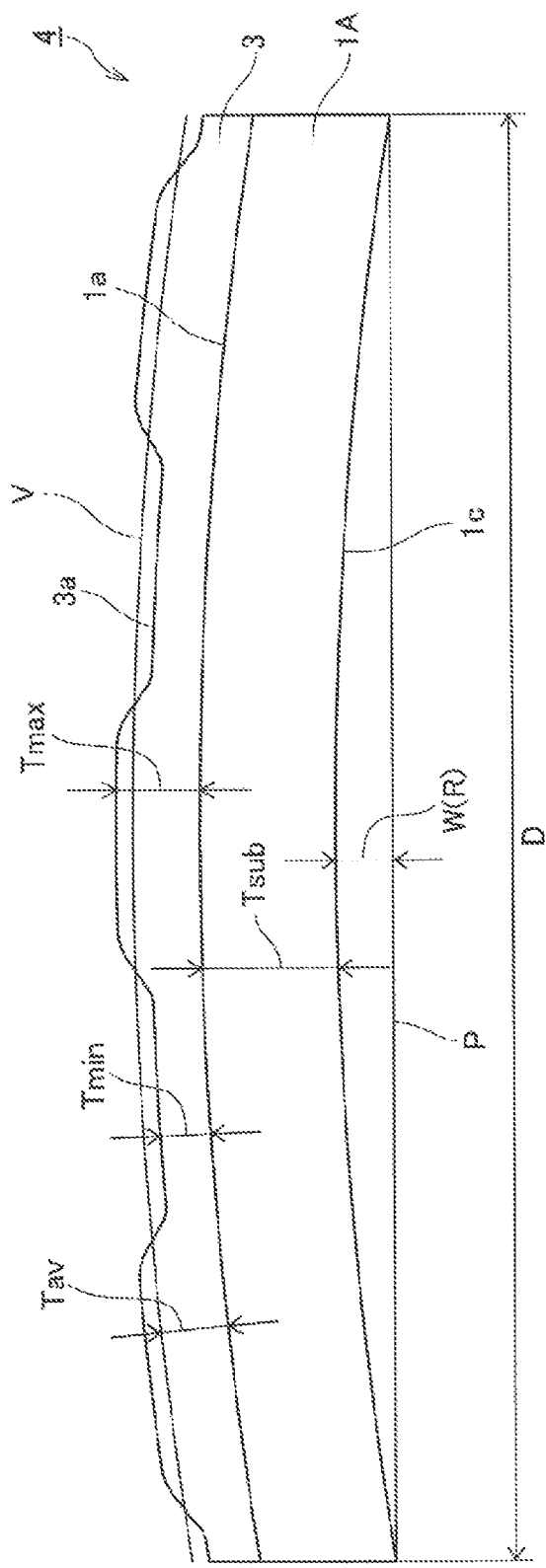
FIG. 1 is a schematic view showing construction of a composite substrate 4.

For example, as shown in FIG. 1, the composite substrate 4 includes a sapphire substrate 1A and a layer 3 of a nitride of a group 13 element provided on a surface 1a of the sapphire substrate 1A.

Here, the layer 3 of the nitride of the group 13 element may be formed directly on the surface 1a of the sapphire substrate 1a. Alternatively, a seed crystal film may be formed on the surface 1a, and the layer of the nitride of the group 13 element may be further formed on the seed crystal film In this case, the seed crysal film and the layer 3 of the nitride of the group 13 element may be made of a same material and may be integrated with each other.

Here, the composite substrate satisfies the following formulas (1) to (3).

First, an average thickness (μm) of the layer of the nitride of the group 13 element/a diameter (mm) of the sapphire substrate is made 5.0 or more and 10.0 or less (formula (1)).

The average thickness (μm) of the layer of the nitride of the group 13 element corresponds to Tav shown in FIG. 1. That is, the layer 3 of the nitride of the group 13 element includes parts having relatively large thickness and parts having relatively small thickness. The thickness of the layer 3 of the nitride of the group 13 element means a distance between a surface 1a of the sapphire substrate 1A and a surface 3a of the layer of the nitride of the group 13 element. "V" is an imaginary line showing the position of the surface corresponding to the film thickness Tav.

Here, the average thickness Tav (in the unit of μm) of the layer 3 of the nitride of the group 13 element/the diameter D (in the unit of mm) of the sapphire substrate 1A is made 5.0 or larger. That is, considering the diameter of the sapphire substrate, the average thickness of the layer of the nitride of the group 13 element is made large at some degree to maintain the strength, so that the cracks can be effectively prevented. On the viewpoint, the average thickness Tav (μm) of the layer 3 of the nitride of the group 13 element/the diameter D (mm) of the sapphire substrate 1A may preferably be made 6.0 or larger.

Further, considering the diameter of the sapphire substrate, in the case that the average thickness of the layer of the nitride of the group 13 element is too large, the cracks rather tends to occur. The average thickness Tav (μm) of the layer 3 of the nitride of the group 13 element/the diameter D (mm) of the sapphire substrate 1A is thereby made 10.0 or smaller. On the viewpoint, the average thickness Tav (μm) of the layer 3 of the nitride of the group 13 element/the diameter D (mm) of the sapphire substrate 1A may preferably be made 9.0 or smaller.

Further, according to the formula (2), the warpage W(R) (mm) of said composite substrate×(50/diameter D (mm) of the composite substrate)$^2$ is made 0.1 or larger and 0.6 or smaller.

That is, after the diameter D of the composite substrate is considered and standardized, it was proved that the cracks described above can be reduced by making the warpage of the composite substrate larger at some degree. On the viewpoint, the warpage W(R) (mm) of the composite substrate×(50/diameter D (mm) of the composite substrate)$^2$ is made 0.1 or larger and preferably 0.2 or larger.

On the other hand, on the supposition that the diameter D of the composite substrate is considered and standardized, the cracks tend to occur in the case that the warpage of the composite substrate is too large. On the viewpoint, the warpage W(R) (mm) of the composite substrate×(50/diameter D (mm) of the composite substrate)$^2$ is made 0.6 or smaller and preferably 0.5 or smaller.

Furthermore, as shown in the formula (3), the maximum value (μm) of the thickness of the layer of the nitride of the group 13 element/the minimum value (μm) of the thickness of the layer of the nitride of the group 13 element is made 1.10 or larger. The maximum value of the thickness of the layer of the nitride of the group 13 element corresponds to Tmax shown in FIG. 1, and the minimum value of the thickness of the layer of the nitride of the group 13 element corresponds to Tmin. As described earlier, the thickness of the layer of the nitride of the group 13 element is not made constant to provide deviation in thickness, so that the cracks in the layer of the nitride of the group 13 element can be reduced.

On the viewpoint, the maximum value (μm) of the thickness of the layer of the nitride of the group 13 element/the minimum value (μm) of the thickness of the layer of the nitride of the group 13 element may preferably be made 1.14 or larger. Further, the number of the cracks rather tends to increase in the case that the ratio of the thickness is too large, the thickness of the layer of the nitride of the group 13 element/the minimum value (μ m) of the thickness of the layer of the nitride of the group 13 element may preferably be 1.6 or smaller and more preferably 1.5 or smaller.

According to a preferred embodiment, as shown in the formula (4), the average thickness Tav (mm) of the layer of the nitride of the group 13 element/thickness Tsub (mm) of the sapphire substrate is made 1.0 or smaller. By making the average thickness of the layer of the nitride of the group 13 element is made smaller than the thickness of the sapphire substrate, the excessive concentration of the stress along the interface of them can be suppressed easier. On the viewpoint, the average thickness Tav (mm) of the layer of the nitride of the group 13 element/thickness Tsub (mm) of the sapphire substrate is preferably made 0.9 or smaller.

Further, in the case that the average thickness of the layer of the nitride of the group 13 element is too small with respect to the thickness of the sapphire substrate, the cracks tend to occur due to insufficient strength of the layer of the nitride of the group 13 element. On the viewpoint of preventing this, the average thickness Tav (mm) of the layer of the nitride of the group 13 element/thickness Tsub (mm) of the sapphire substrate may preferably be made 0.2 or larger and more preferably be made 0.3 or larger.

Figure 2A:
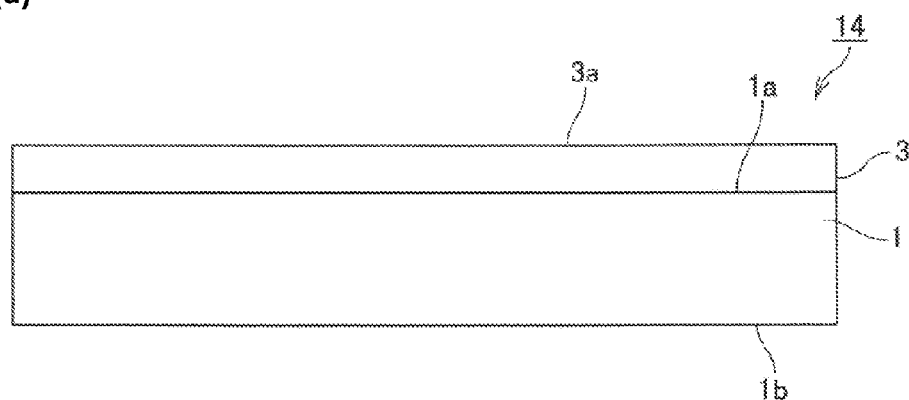
FIG. 2(a) is a view showing a layer 3 of a nitride of a group 13 element on a sapphire substrate 1.

For obtaining the composite substrate, for example as shown in FIG. 2(a), a seed crystal layer is formed on a main face 1a of a sapphire substrate. Then, a layer 3 of a nitride of a group 13 element is formed by flux method on the seed crystal layer.

Figure 2B:
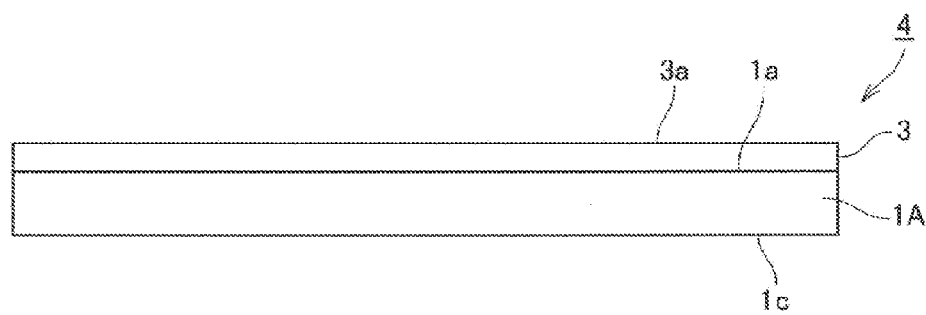
FIG. 2(b) shows the composite substrate 4.
Figure 3A:
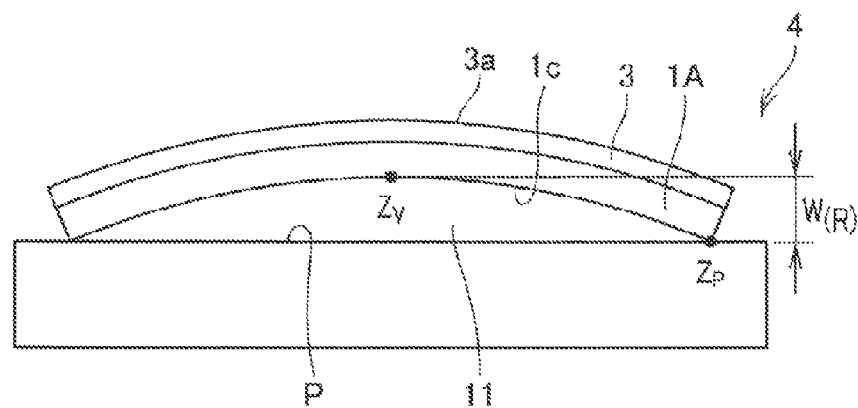
FIG. 3(a) is a schematic diagram for explaining a measurement method for a warpage of the composite substrate, in which the composite substrate is bent upwardly in convex form with a sapphire substrate provided downside.

Warpage is generated in the thus obtained composite substrate 14 due to film-formation and cooling during the flux method. The warpage has a convex shape upwardly with the sapphire substrate placed downwardly, as schematically shown in FIG. 3(a). In the case that the magnitude of the warpage is adjusted, for example as shown in FIG. 2(b), by polishing a bottom face 1b of the sapphire substrate 1 to form a supporting substrate 1A after the polishing, processing stress can be introduced into structure of the supporting substrate to reduce the warpage.

(Sapphire Substrate)

The wurtzite structure of sapphire has the c-plane, the a-plane, and the m-plane. These respective crystal planes are defined crystallographically. The growth direction of an underlying layer, a seed crystal layer, and a layer of group 13 nitride crystal grown by the flux method may be a direction normal to the c-plane, or may also be a direction normal to each of the a-plane and the m-plane.

On the viewpoint of the present invention, for preventing the separation of the layer of the nitride of the group 13 element, the thickness of the sapphire substrate may preferably be 300 to 1600 μm and more preferably be 400 to 1300 μm.

(Seed Crystal)

The seed crystal may preferably be composed of a nitride cruystal of a group 13 element. The group 13 element means any group 13 element according to the Periodic Table determined by IUPAC. The group 13 elements are specifically gallium, aluminum, indium, thallium and the like. The nitride of the group 13 element may particularly preferably be GaN, AlN or AlGaN.

The seed crystal film may be composed of a single layer, or may include a buffer layer on the side of the sapphire substrate.

Methods for forming the seed crystal layer may be vapor phase epitaxy method as a preferred example, and includes metal organic chemical vapor deposition (MOCVD) method, hydride vapor phase epitaxy (HVPE) method, pulse excited deposition (PXD) method, MBE method and sublimation method. The metal organic chemical vapor deposition method is particularly preferred. Further, the film-forming temperature may preferably be 950 tp 1200° C.

(Layer of Nitride of Group 13 Element)

Manufacturing methods of the layer of the nitride of the group 13 element are not specifically limited, and includes metal organic chemical vapor deposition (MOCVD) method, hydride vapor phase epitaxy (HVPE) method, pulse excited deposition (PXD) method, MBE method, vapor phase method such as sublimation method, a liquid phase method, such as flux method, and the like.

The nitride of the group 13 element forming the crystal layer is composed of gallium nitride, aluminum nitride or gallium aluminum nitride. Further, as an additive to the nitride of the group 13 element includes carbon, a metal of a low melting point (tin, bismuth, silver, gold) and a metal of a high melting point (a transition metal such as iron, manganese, germanium, zinc, titanium, chromium or the like).

According to a preferred embodiment, the layer of the nitride of the group 13 element is grown by flux method. At this time, the kind of the flux is not specifically limited as long as the flux can form the nitride crystal of the group 13 element. In a preferred embodiment, the flux containing at least one of an alkali metal and alkali earth metal is used, and more preferably the flux contains sodium metal.

In the flux, a raw material for the group 13 element is mixed and used. As the raw material, the single metal, alloy or compound may be used. In terms of handling, the single metal may be preferred.

The ratio (molar ratio) of the group 13 element/flux (for example sodium) in the melt may preferably be larger on the viewpoint of the present invention, and preferably be 13 mol % or higher and more preferably be 18 mol % or higher. However, in the case that the ratio is too high, the crystal quality tends to be deteriorated. The ratio is thus preferably 40 mol % or lower.

The nitride of the group 13 element grown by flux method emits broad fluorescence (blue fluorescence) having a peak in a wavelength of 440 to 470 nm, in the case that it is irradiated light of a wavelength of 330 to 385 nm (for example light emitted from a mercury lamp). On the other hand, the nitride of the group 13 element produced by a vapor phase process emits broad fluorescence (yellow fluorescence) having a peak in a wavelength of 540 to 580 nm, in the case that it is irradiated light of a wavelength of 330 to 385 nm. It is thereby possible to distinguish the nitride crystals of the group 13 element obtained by flux method and vapor phase process, based in the color of fluorescence emitted by irradiating the light of a wavelength of 330 to 385 nm.

(Warpage of Composite Substrate)

The thus obtained composite substrate has a warpage due to the film-formation by the flux method and cooling. Generally as shown in FIG. 3(a), the warpage is such that the composite substrate has a convex shape upwardly with the sapphire substrate set downwardly.

The warpage is measured by the method disclosed in the patent document 3 (Japanese Patent Publication No. 2009-111423A).

Figure 3B:
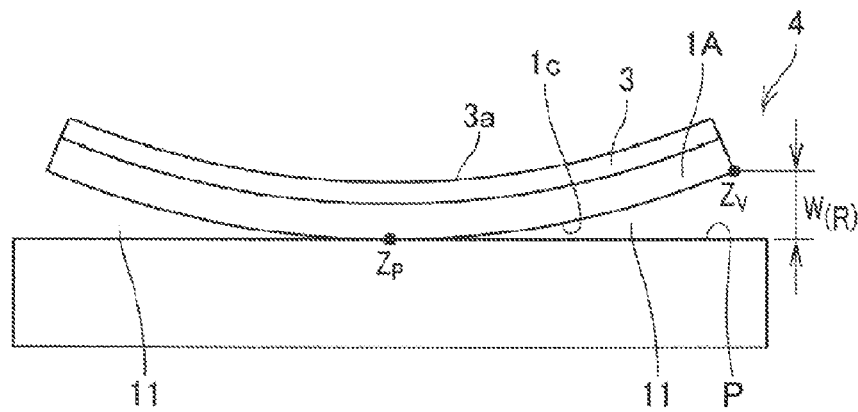
FIG. 3(b) is a schematic diagram for explaining the measurement method for the warpage of the composite substrate, in which the composite substrate is bent upwardly in concave form with a sapphire substrate provided downside.

Specifically, referring to FIG. 3, the method of measuring the warpage will be described.

In an example shown in FIG. 3(a), a sample (composite substrate) 4 is warped in such a manner that a bottom surface 1c of the sapphire substrate 1A of a specimen (composite substrate) 4 has a concave shape, while the layer of the nitride of the group 13 element has a convex shape. This warpage is defined as the positive warpage (indicated by reference character +). On the other hand, in an example shown in FIG. 3(b), the composite substrate is warped in such a manner that the bottom surface 1c of the sapphire body 1A of the specimen (composite substrate) 4 has a convex shape, while the gallium nitride crystal layer has a concave shape. This warpage is defined as the negative warpage (indicated by reference character "−"). The curved surface formed by the bottom surface 1c of the composite substrate 4 is hereinafter referred to as a "warped and curved surface".

Further, it is supposed that a plane minimizing an average distance between the warped and curved surface and a plane P is defined as the optimal plane P. Then, a distance between the warped and curved surface and the optimal plane P is measured. That is, zp is a point on the bottom surface 1c located on the optimal plane P within a region of the bottom surface having 2 inches (5.08 cm) in length. Further, zv is a point of the bottom surface 1c farthest from the optimal plane P. Accordingly, the warpage W(R) is defined as a distance between the point zv and the optimal plane P. Reference numeral 11 denotes a gap between the specimen and the plane P.

In other words, the warpage W(R) is a difference in height, on the bottom surface 1c, between the point zp closest to the optimal plane P and another point zv farthest from the optimal plane P.

The warpage of the composite substrate can be measured by a laser displacement gauge. The laser displacement gauge is a device that measures displacement of the bottom surface of the composite substrate by irradiating the bottom surface of the composite substrate with laser light. As the measurement system, a laser focus system or an optical interference system may be used depending on surface roughness with a wavelength of a laser set at 633 nm.

(Irradiation of Laser Light)

The composite substrate is held and the laser light is irradiated to the side of the sapphire substrate, so as to decompose crystal lattice bonds at an interface between the layer of the nitride of the group 13 element and sapphire substrate.

The wavelength of the laser light is selected depending on the material of the nitride of the group 13 element to be separated. The wavelength is generally 380 nm or shorter, and preferably 150 to 380 nm. Further, ArF excimer laser, KrF excimer laser, XeCl excimer laser, third harmonic wave Nd:YAG laser or the like may be used.

For example, for separating the following materials, it may preferably be used the laser light having the following wavelength range.

GaN; 200 to 360 nm
AlN; 150 to 200 nm
GaAlN; 200 to 250 nm

A method of performing laser lift-off method is not particularly limited. For example, laser beam emitted from a laser oscillator is passed through a beam expander, a pillar lens or a convex lens, dichroic mirror and a condensing lens to obtain condensed laser beam, which is then irradiated to the composite substrate on an X-Y stage. By combining the pillar and condensing lenses, the focal lengths are made different to one another in the x and y-directions. For example, it becomes possible to form the laser beam having an elliptical shape which is strongly focused in the x direction and de-focused in the y direction.

It is further possible to utilize a laser lift-off system utilizing a beam scanner. That is, the laser beam emitted from a laser oscillator is passed through a beam expander, a pillar lens or convex lens, a reflecting mirror, a garvano scanner and an fθ lens to obtain condensed laser beam, which is then irradiated to the composite substrate on the moving X-Y stage.

The used laser beam may be irradiated while scanning the whole bottom face of the composite substrate. Alternatively, the position of the laser light may be fixed and the stage holding the composite substrate may be moved to scan the bottom face of the composite substrate.

The spot of the laser beam may be moved horizontally and vertically on the composite substrate to scan it. Further, the diameter of each spot may preferably be 1 to 5 mm. Further, the moving speed of the spot may preferably be 10 to 50 mm/sec, although it depends on repetition frequency of a pulse laser.

In the case that the spot of the laser beam is moved on the composite substrate, it is preferred that the adjacent spots overlap one another. It is thereby possible to prevent non-irradiated regions.

Generally the power of the laser light may preferably be 0.1 to 0.5 $J/cm^2$, although it depends on an object to be processed, oscillating wavelength of the laser and pulse width.

Further, when the composite substrate is held, it is possible to relax the warpage and to relax the stress caused by the adjustment of the warpage, by heating the composite substrate. The heating temperature may preferably be 100 to 500° C. and more preferably be 200 to 300° C. However, such heating is optional and the irradiation of the laser light can be performed at a room temperature.

(Functional Layer and Device)

The thus obtained layer of the nitride of the group 13 element is subjected to beveling process at its outer peripheral part and both faces thereof is subjected polishing to obtain a self-supporting wafer. A functional layer is formed on the wafer by vapor phase process.

The functional layer may be composed of a single layer or a plurality of layers. Further, as the function, it may be used for a white LED with high brightness and color rendering properties, a blue-violet laser disk for high-speed and high-density optical memory, and a power device for an inverter for hybrid vehicles, and the like.

EXAMPLES

A composite substrate 4 was obtained according to the procedure shown in FIG. 2. Specifically, on sapphire substrates 1 having diameters of 50.8 mm, 75 mm and 100 mm, respectively, seed crystal layers composed of gallium nitride were formed, respectively, by organic metal chemical vapor deposition. A layer 3 of gallium nitride single crystal was formed thereon. A bottom face 1b of the sapphire substrate was then polished.

As to the thus obtained composite substrate, it was measured the diameter (mm) and thickness (mm) of the sapphire substrate, warpage of the composite substrate, average thickness (mm) of the layer of the nitride of the group 13 element, and the maximum and minimum values of the thickness of the nitride layer. The results of the measurement were shown in table 1.

The respective properties were measured as follows.

(Thickness (mm) of Sapphire Substrate)

The thickness of the sapphire substrate was measured by a micrometer of contact type. Further, the thickness of the sapphire substrate was also measured by optical system of non-contact type.

(Warpage of Composite Substrate)

The warpage was measured as described above.

(Average Thickness (μm), Maximum and Minimum Thicknesses of Layer of Nitride of Group 13 Element)

The thickness of the composite substrate was measured by the micrometer of contact type and optical system of non-contact type. The thickness of the sapphire substrate measured in advance was subtracted from the thickness of the composite substrate to obtain the thickness of the layer of the nitride of the group 13 element.

The composite substrate 4 was set on a table through a cushion member. The table was made of stainless steel and a surface of the table was made flat surface. At this state, the table was positioned over a driving stage. The stage was moved while irradiating pulses (with a repetition frequency of 10 Hz and pulse width of 5 ns) of third harmonic wave (ultraviolet laser light of a wavelength of 355 nm) of a flash lamp-excited Q switch Nd:YAG laser from above. The composite substrate was serially scanned from the end. The beam size of the laser light was shaped and condensed using pinhole and convex lens, so that the beam shape was made a circle having a diameter of 3.0 mm on the composite substrate. The energy of one pulse was 0.25 mJ/cm$^2$. The scanning was made so that the respective shot regions of the adjacent pulses slightly overlap one another. That is, the scanning speed was made 27 mm/sec.

After the scanning of the laser was completed, the composite substrate was immersed in hot water of 40° C. so that gallium metal (melting point of 29° C.), generated along an interface between the sapphire substrate and layer of the nitride of the group 13 element, was molten. The thus separated sapphire substrate and the layer of the nitride of the group of 13 element were obtained. Thereafter, the outer peripheral part of the thus separated layer of the nitride of the group 13 element was subjected to the beveling treatment, and both sides thereof were subjected to polishing to obtain a self-supporting wafer.

Here, after the sapphire substrate and layer of the nitride of the group 13 element were separated, the presence or absence of the cracks in the layer was confirmed by visual evaluation. The results were shown in tables. Besides, 10 samples were prepared for each example and total number of the cracks per 10 samples was counted.

TABLE 1

| | Diameter of substrate mm | Thickness of Nitride layer | | | Warpage Of Composite substrate mm | Thickness Of Nitride Layer Max./Min. | Average Thickness Of nitride Layer/Diameter of Sapphire substrate | Warpage of Composite substrate × (50/diameter of composite substrate)$^2$ | Number of Cracks Per 10 sample |
|---|---|---|---|---|---|---|---|---|---|
| | | Average um | Max. um | Min. um | | | | | |
| Ex. 1 | 50.8 | 255 | 284 | 247 | 0.252 | 1.15 | 5.0 | 0.24 | 1 |
| Ex. 2 | 50.8 | 453 | 502 | 422 | 0.114 | 1.19 | 8.9 | 0.11 | 1 |
| Ex. 3 | 50.8 | 448 | 572 | 395 | 0.251 | 1.45 | 8.8 | 0.24 | 0 |
| Ex. 4 | 50.8 | 436 | 495 | 382 | 0.411 | 1.30 | 8.6 | 0.40 | 0 |
| Ex. 5 | 50.8 | 510 | 541 | 454 | 0.602 | 1.19 | 10.0 | 0.58 | 2 |
| Ex. 6 | 75 | 384 | 424 | 362 | 1.242 | 1.17 | 5.1 | 0.55 | 2 |
| Ex. 7 | 75 | 496 | 572 | 448 | 0.405 | 1.28 | 6.6 | 0.18 | 1 |

TABLE 2

| | Diameter of substrate mm | Thickness of Nitride layer | | | Warpage Of Composite substrate mm | Thickness Of Nitride Layer Max./Min. | Average Thickness Of nitride Layer/ Diameter of Sapphire substrate | Warpage of Composite substrate × (50/diameter of composite substrate)$^2$ | Number of Cracks Per 10 sample |
|---|---|---|---|---|---|---|---|---|---|
| | | Average um | Max. um | Min. um | | | | | |
| Ex. 8 | 75 | 628 | 682 | 547 | 0.582 | 1.25 | 8.4 | 0.26 | 0 |
| Ex. 9 | 75 | 695 | 748 | 668 | 0.725 | 1.12 | 9.3 | 0.32 | 2 |
| Ex. 10 | 75 | 582 | 614 | 550 | 0.985 | 1.12 | 7.8 | 0.44 | 1 |
| Ex. 11 | 100 | 505 | 542 | 486 | 0.521 | 1.12 | 5.1 | 0.13 | 2 |
| Ex. 12 | 100 | 547 | 582 | 507 | 0.896 | 1.15 | 5.5 | 0.22 | 1 |
| Ex. 13 | 100 | 628 | 682 | 580 | 1.208 | 1.18 | 6.3 | 0.30 | 0 |
| Ex. 14 | 100 | 745 | 784 | 712 | 1.453 | 1.10 | 7.5 | 0.36 | 1 |
| Ex. 15 | 100 | 857 | 914 | 804 | 1.852 | 1.14 | 8.6 | 0.46 | 0 |

TABLE 3

| | Diameter of substrate mm | Thickness of Nitride layer | | | Warpage Of Composite substrate mm | Thickness of Nitride Layer Max./Min. | Average Thickness Of nitride Layer/ Diameter of Sapphire substrate | Warpage of Composite substrate × (50/diameter of composite substrate)$^2$ | Number of Cracks Per 10 sample |
|---|---|---|---|---|---|---|---|---|---|
| | | Average um | Max. um | Min. um | | | | | |
| Com. Ex. 1 | 50.8 | 202 | 286 | 204 | 0.121 | 1.40 | 4.0 | 0.12 | 8 |
| Com. Ex. 2 | 50.8 | 182 | 256 | 220 | 0.152 | 1.16 | 3.6 | 0.15 | 9 |
| Com. Ex. 3 | 50.8 | 536 | 592 | 521 | 0.305 | 1.14 | 10.6 | 0.30 | 8 |
| Com. Ex. 4 | 50.8 | 598 | 802 | 725 | 0.652 | 1.11 | 11.8 | 0.63 | 10 |
| Com. Ex. 5 | 50.8 | 462 | 525 | 415 | 0.692 | 1.27 | 9.1 | 0.67 | 8 |
| Com. Ex. 6 | 75 | 325 | 352 | 293 | 0.352 | 1.20 | 4.3 | 0.16 | 8 |
| Com. Ex. 7 | 75 | 294 | 371 | 241 | 0.152 | 1.54 | 3.9 | 0.07 | 10 |

TABLE 4

| | Diameter of substrate mm | Thickness of Nitride layer | | | Warpage Of Composite substrate mm | Thickness of Nitride Layer Max./Min. | Average Thickness of nitride Layer/ Diameter of Sapphire substrate | Warpage of Composite substrate × 850/ diameter of composite substrate)² | Number of Cracks Per 10 sample |
|---|---|---|---|---|---|---|---|---|---|
| | | Average um | Max. um | Min. um | | | | | |
| Com. Ex. 8 | 75 | 284 | 325 | 256 | 0.572 | 1.27 | 3.8 | 0.25 | 8 |
| Com. Ex. 9 | 75 | 852 | 901 | 805 | 0.475 | 1.12 | 11.4 | 0.21 | 9 |
| Com. Ex. 103 | 75 | 915 | 963 | 863 | 0.824 | 1.12 | 12.2 | 0.37 | 8 |
| Com. Ex. 11 | 100 | 241 | 282 | 215 | 1.054 | 1.31 | 2.4 | 0.26 | 8 |
| Com. Ex. 12 | 100 | 305 | 368 | 284 | 1.823 | 1.30 | 3.1 | 0.46 | 8 |
| Com. Ex. 13 | 100 | 682 | 743 | 671 | 2.530 | 1.11 | 6.8 | 0.63 | 9 |
| Com. Ex. 14 | 100 | 597 | 645 | 568 | 2.825 | 1.14 | 6.0 | 0.71 | 8 |
| Com. Ex. 15 | 100 | 1205 | 1258 | 1120 | 0.521 | 1.12 | 12.1 | 0.13 | 9 |

TABLE 5

| | Diameter of substrate mm | Thickness of Nitride layer | | | Warpage Of Composite substrate mm | Thickness Of Nitride Layer Max./Min. | Average Thickness Of nitride Layer/ Diameter of Sapphire substrate | Warpage of Composite substrate × (50/diameter of composite substrate)² | Number of Cracks Per 10 sample |
|---|---|---|---|---|---|---|---|---|---|
| | | average um | Max. um | Min. um | | | | | |
| Com. Ex. 16 | 50.8 | 441 | 455 | 416 | 0.325 | 1.09 | 8.7 | 0.31 | 10 |
| Com. Ex. 17 | 75 | 525 | 538 | 511 | 0.685 | 1.05 | 7.0 | 0.30 | 10 |
| Com. Ex. 18 | 100 | 525 | 529 | 521 | 0.925 | 1.02 | 5.3 | 0.23 | 10 |

As can be seen from the above results, according to the present invention, it was possible to prevent the crack generation in separating the sapphire substrate and layer of the nitride of the group 13 element by laser irradiation.

The invention claimed is:

1. A method of separating a layer of a nitride of a group 13 element: the method comprising the steps of;
    preparing a composite substrate comprising a sapphire substrate and said layer of said nitride of said group 13 element provided on said sapphire substrate, said layer of said nitride of said group 13 element comprising gallium nitride, aluminum nitride or gallium aluminum nitride, and said composite substrate satisfying the following formulas (1), (2) and (3); and
    irradiating a laser light to said composite substrate from the side of said sapphire substrate to decompose crystal lattice bonds at an interface between said sapphire substrate and said layer of said nitride of said group 13 element,
    wherein the formula (1) is 5.0≤(an average thickness (μm) of said layer of said nitride of said group 13 element/ a diameter (mm) of said sapphire substrate)≤10.0,
    wherein the formula (2) is 0.1≤a warpage (mm) of said composite substrate×(50/a diameter (mm) of said composite substrate)²≤0.6,
    wherein the formula (3) is 1.10≤a maximum value (μm) of a thickness of said layer of said nitride of said group 13 element / a minimum value (μm) of said thickness of said layer of said nitride of said group 13 element.

2. The method of claim 1, wherein said maximum value (μm) of said thickness of said layer of said nitride of said group 13 element / said minimum value (μm) of said thickness of said layer of said nitride of said group 13 element is 1.60 or smaller, in said formula (3).

3. The method of claim 1, wherein said composite substrate satisfies the following formula (4),
    wherein the formula (4) is 0.2≤an average thickness (mm) of said layer of said nitride of said group 13 element / a thickness (mm) of said sapphire substrate≤1.0.

4. The method of claim 1, wherein at least a part of said layer of said nitride of said group 13 element is grown by flux method under an atmosphere including a nitrogen-containing gas from a melt.

5. A composite substrate comprising a sapphire substrate and a layer of a nitride of a group 13 element provided on said sapphire substrate, said layer of said nitride of said group 13 element comprising gallium nitride, aluminum nitride or gallium aluminum nitride, and said composite substrate satisfying the following formulas (1), (2) and (3),
    wherein the formula (1) is 5.0≤(an average thickness (μm) of said layer of said nitride of said group 13 element/ a diameter (mm) of said sapphire substrate)≤10.0,
    the formula (2) is 0.1≤a warpage (mm) of said composite substrate×(50/a diameter (mm) of said composite substrate)²≤0.6,
    the formula (3) is 1.10≤a maximum value (μm) of a thickness of said layer of said nitride of said group 13 element / a minimum value (μm) of said thickness of said layer of said nitride of said group 13 element.

6. The composite substrate of claim 5, wherein said maximum value (μm) of said thickness of said layer of said nitride of said group 13 element / said minimum value (μm) of said thickness of said layer of said nitride of said group 13 element is 1.60 or smaller, in said formula (3).

7. The composite substrate of claim 5, wherein said composite substrate satisfies the following formula (4), wherein the formula (4) is 0.2≤an average thickness (mm) of said layer of said nitride of said group 13 element / a thickness (mm) of said sapphire substrate≤1.0.

8. The composite substrate of claim 5, wherein said layer of said nitride of said group 13 element emits a fluorescence having a peak in a wavelength of 440 to 470 nm, provided that a light of a wavelength of 330 to 385 nm is irradiated to said layer.

9. The composite substrate of claim 5, wherein said layer of said nitride of said group 13 element emits a fluorescence having a peak in a wavelength of 540 to 580 nm, provided that a light of a wavelength of 330 to 385 nm is irradiated to said layer.

* * * * *